United States Patent
Ishikawa et al.

(10) Patent No.: US 7,756,216 B2
(45) Date of Patent: Jul. 13, 2010

(54) SIGNAL PEAK VOLTAGE SUPPRESSION APPARATUS

(75) Inventors: Hiroyoshi Ishikawa, Kawasaki (JP); Hajime Hamada, Kawasaki (JP); Kazuo Nagatani, Kawasaki (JP); Nobukazu Fudaba, Kawasaki (JP); Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 924 days.

(21) Appl. No.: 11/443,072

(22) Filed: May 31, 2006

(65) Prior Publication Data
US 2007/0195909 A1   Aug. 23, 2007

(30) Foreign Application Priority Data
Feb. 17, 2006  (JP) .............................. 2006-040697

(51) Int. Cl.
*H04L 25/03* (2006.01)
(52) U.S. Cl. .................. 375/296; 375/377; 455/114.35; 455/115.3; 455/127.2; 327/179; 327/180; 327/309
(58) Field of Classification Search .................. 375/296, 375/345, 377; 455/114.3, 115.3, 127.2, 232.1, 455/234.1, 239.1, 240.1, 241.1, 245.1, 245.2, 455/250.1; 327/50, 58, 178–180, 306, 308, 327/309
See application file for complete search history.

(56) References Cited

U.S. PATENT DOCUMENTS

| 4,931,743 | A  | * | 6/1990 | Fukuda et al. ............... 327/551 |
| 5,182,520 | A  | * | 1/1993 | Urata .......................... 327/363 |
| 5,737,434 | A  | * | 4/1998 | Orban ......................... 381/106 |
| 6,337,999 | B1 | * | 1/2002 | Orban ......................... 700/94 |
| 6,504,862 | B1 | * | 1/2003 | Yang .......................... 375/146 |
| 2004/0090283 | A1 | * | 5/2004 | Naito | |
| 2004/0203430 | A1 |  | 10/2004 | Morris | |

FOREIGN PATENT DOCUMENTS

| JP | A-H10-178414 | 6/1998 |
| JP | A-2002-044054 | 2/2002 |
| JP | A-2004-064711 | 2/2004 |
| JP | A-2005-094426 | 4/2005 |
| WO | WO 03/075457 A2 | 9/2003 |

* cited by examiner

*Primary Examiner*—Dac V Ha
(74) *Attorney, Agent, or Firm*—Hanify & King, PC

(57) ABSTRACT

As in a conventional technology, a hard clipping process and a filtering process are performed on a transmission signal. An original transmission signal is subtracted from a signal on which the processes have been performed, and an inverse sign signal to the suppressed signal is retrieved. By giving a gain to the signal, and adding up to the original transmission signal, a peak voltage is suppressed. The gain can be a ratio of a difference signal between a hard clipped signal and an original transmission signal to a signal of suppression of a filtered signal from the original transmission signal, or a value determined by a simulation depending on the cutoff frequency of a low pass filter used in the filtering process.

14 Claims, 13 Drawing Sheets

SIGNAL PEAK VOLTAGE SUPPRESSION APPARATUS

BACKGROUND OF THE INVENTION

1. Field of the Invention

The present invention relates to an apparatus for suppressing a peak amplitude of a transmission signal in a wireless communication device.

2. Description of the Related Art

In a wireless communication device, a power amplifier amplifies a generated signal and transmits the resultant signal. Since an amplifier consumes a lot of power, it is desired to use the amplifier with high power use efficiency. However, while the power use efficiency of an amplifier is the more powerfully enhanced when the amplifier is used where the output power is the higher, it has the feature that the output is saturated. When the amplifier is saturated, distortion of its output signal occurs, the spread of a spectrum occurs outside the frequency band of a transmission signal, thereby causing an interference wave to other frequencies. It is important to efficiently use the amplifier in a limited input voltage range without distortion.

Thus, there has been a method of transmitting a signal with the lowest possible peak average per ratio (PAPR) to the average power of a transmission signal because, if the limited input voltage range of an amplifier is kept, and a signal of high average power is amplified, an amplifier can be used with high operation efficiency without causing distortion. The conventional peak suppressing method proposed for a transmission signal and realized by combining the hard clipping (HC) in nonlinear processing and filtering (low pass filter (LPF)).

FIG. 1 is an explanatory view of a conventional peak suppressing method.

In the hard clipping process, the hard clipping is performed on a suppression target value for a transmission signal having the amplitude exceeding a suppression target value. That is, the amplitude exceeding the suppression target value is forcibly cut off. In the filtering process, the component outside the signal frequency band of the transmission signal generated in the hard clipping process is cut off. The amplitude of the peak component is low relative to the signal before suppression.

The patent document 1 relates to the conventional method of improving the efficiency of the power amplifier. In the patent document 1, the envelope of a transmission signal is suppressed such that the set level cannot be exceeded, the signal band is limited by a filter, the signal is modulated, and then amplified by the power amplifier

[Patent Document 1] Japanese Patent Application Publication No. H10-178414

As shown in FIG. 1, when peak suppression is performed by combining the conventional hard clipping and filtering, there occurs the problem that a peak is rebuilt after passing the LPF (the amplitude exceeds the suppression target value again).

Therefore, to suppress the peak of a signal to desired amplitude, the following two methods have been conventionally used.

(1) Method of suppressing the peak by strongly performing the HC processing with the peak rebuilding after passing the LPF taken into account (2) Method of suppressing the rebuilt peak by repeatedly performing the process of (HC+LPF)

However, in (1) above, there is the problem that the modulation precision to the amount of peak suppression and the degradation of the bit error rate increase. In (2) above, there is the problem that the circuit is large, thereby requiring larger power consumption and increased process delay.

SUMMARY OF THE INVENTION

The present invention aims at providing a signal peak voltage suppression apparatus capable of suppressing power consumption by a small apparatus without degradation of modulation precision and bit error rate.

The peak voltage suppression apparatus includes: a temporary peak suppression device for temporarily suppressing the peak of the amplitude of a signal; a difference signal acquisition device for acquiring a difference signal between the temporarily suppressed signal and the original signal, a gain device for providing a gain to the difference signal, and a final peak suppression device for generating a signal whose amplitude peak has been suppressed by subtracting the difference signal provided with the gain from the original signal.

As compared with the conventional technology, the present invention can provide an excellent peak suppression apparatus with low EVM (error vector magnitude) and bit error rate.

DESCRIPTION OF THE PREFERRED EMBODIMENTS

In the embodiment of the present invention, for the transmission signal on which the HC processing which is one of the conventional peak suppressing system and the filtering process are performed, the peak suppression component included in the frequency band of a transmission signal is extracted and a gain is given to it. The signal of the peak suppression component provided with the gain is subtracted from the transmission signal before the peak suppression.

Figure 2:
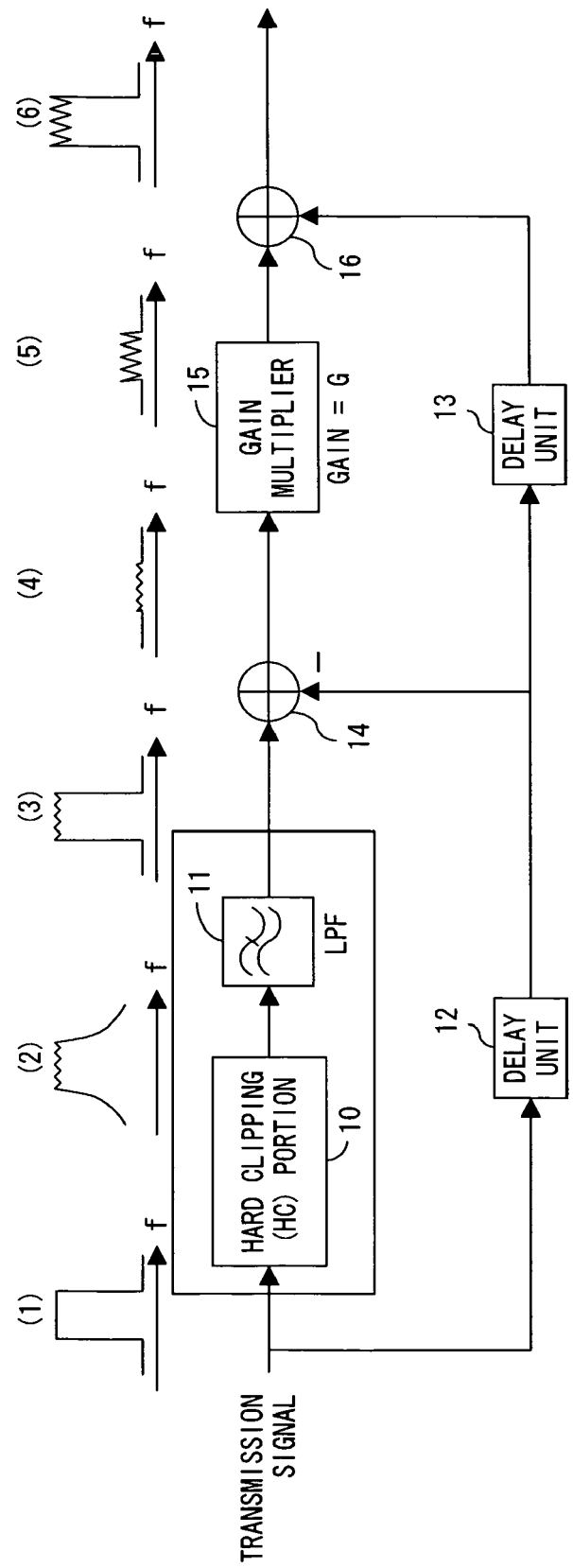
FIG. 2 shows a basic configuration according to an embodiment of the present invention.

FIG. 2 shows the basic configuration according to an embodiment of the present invention.

After the peak suppression similar to the conventional process by a hard clipping portion 10 and a low pass filter 11, the peak suppression component contained in the frequency band of a transmission signal is extracted, and a gain is given to the suppression component and added to the transmission signal before the peak suppression.

Figure 1:
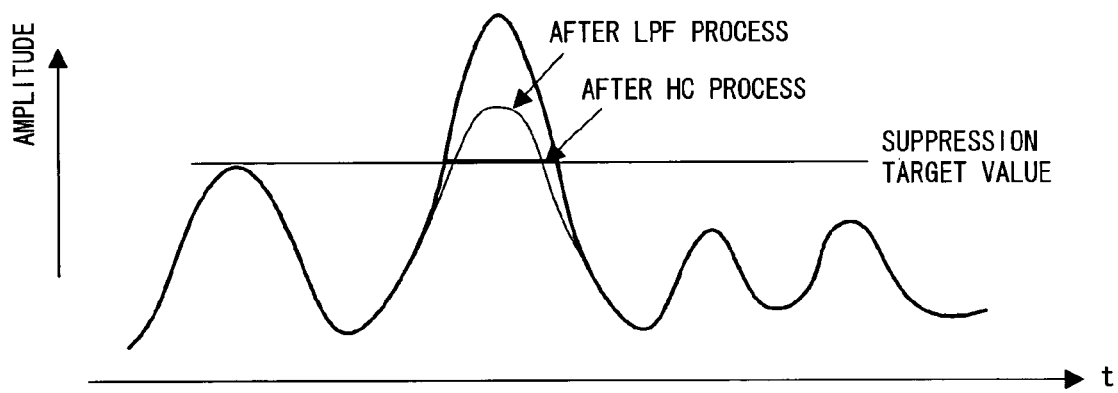
FIG. 1 is an explanatory view of the conventional peak suppressing method.

That is, the hard clipping portion 10 cuts off the voltage amplitude of a signal at the suppression target value, and the low pass filter 11 removes the frequency component outside the signal frequency band generated from the discontinuity of signals generated by the cutoff. Thus, the transmission signal becomes a signal having a peak of low height. However, as explained by referring to FIG. 1, the height of peak returns to the value higher than the suppression target value by the filtering by the low pass filter 11. Therefore, the transmission signal is delayed by a delay unit 12 by a delay time of the processes of the hard clipping portion 10 and the low pass filter 11, and a subtracter 14 performs subtraction from the output of the low pass filter 11. Thus, the signal of the inverse sign of the component (this signal is hereinafter referred to as peak suppression information) obtained by subtracting the output of the low pass filter 11 from the original transmission signal is output from the subtracter 14. The gain multiplier 15 gives a predetermined gain to the result. The original transmission signal is delayed by the delay unit 12, delayed by the delay unit 13 again and then input to an adder 16. The amount of delay by a delay unit 13 is equal to the amount of the process delay time by the gain multiplier 15. The adder 16 adds up the delayed transmission signal and the output of the gain multiplier 15. Since the amounts of delay of the output of the gain multiplier 15 and the output of the delay unit 13 are adjusted, they are added with the synchronous timing. Additionally, since the output of the subtracter 14 is obtained by subtracting the delayed signal having a large peak value from the output of the low pass filter 11 having a small peak value, it is a negative value. Therefore, the arithmetic operation of the adder 16 is actually the operation of subtracting the peak suppression information with a gain from the transmission signal.

The drawings (1) through (6) above the configuration shown in FIG. 2 are schematic charts of the spectrum of the signal immediately below the drawings (1) through (6) in the configuration. (1) is a transmission signal, and includes the components of a predetermined frequency band. When it is processed by the hard clipping portion 10, the component outside a predetermined frequency band is generated as shown by (2). When it is removed by the low pass filter 11, the spectrum as shown by (3) is obtained. The subtracter 14 subtracts (1) from (3), and the peak suppression information (with an inverse sign) obtained as a result is (4). The gain multiplier 15 provides a gain for (4) to obtain (5). The spectrum (6) of the signal is obtained by adding up (1) and (5)

A gain multiplier 15 can be constituted by a digital multiplier. As compared with the case where the hard clipping process and the low pass filter process are repeatedly performed as in the conventional technology, the configuration of the present embodiment can be constituted by one multiplier. Therefore, the configuration can be simplified. That is, a digital low pass filter includes a lot of taps, and requires multipliers equal in number to the taps. Accordingly, as compared with the case where there is one multiplier, providing one low pass filter includes many hardware configurations.

In the description above, the transmission signal used in normal wireless communications can be a complex signal having an I component and a Q component. In the following explanation, what is referred to as the amplitude of a signal is a value obtained in the arithmetic operation of $\sqrt{(I^2+Q^2)}$ in the case of the complex signal. When a real signal is processed, and when a complex signal is processed, the processes are performed in the same methods.

Figure 3B:
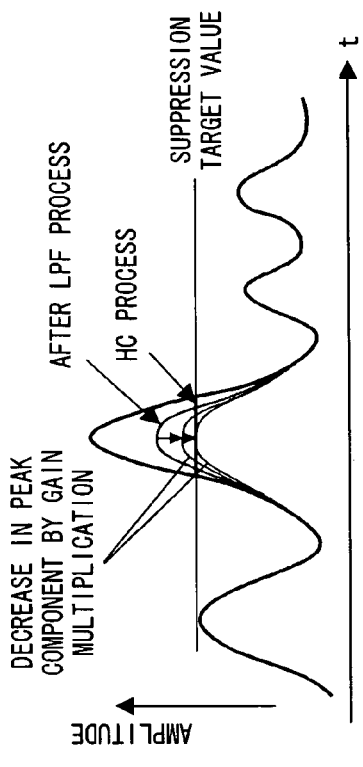
FIGS. 3A and 3B are explanatory views of the operation of the basic configuration according to an embodiment of the present invention shown in FIG. 2.
Figure 3A:
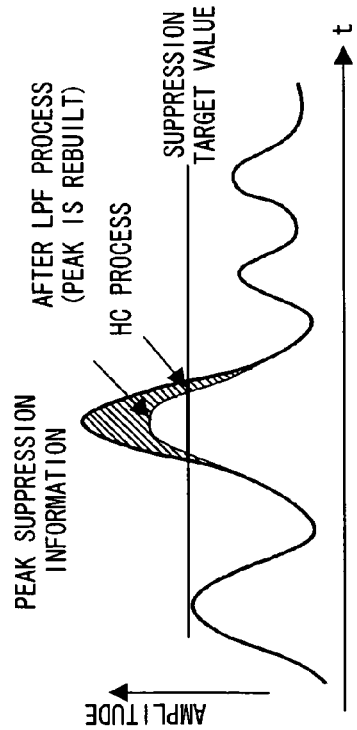

FIGS. 3A and 3B are explanatory views of the operations of the basic configuration according to the embodiments of the present invention.

FIGS. 3A and 3B show examples of the outline of the hard clipping and filtering processes. As shown in FIG. 3A, although the peak amplitude is limited to the target value in the hard clipping process, the peak is rebuilt in the next filtering process. In this example, the diagonally shaded portion shown in FIG. 3A is the peak suppression information.

As shown in FIG. 3B, a gain is given to the peak suppression information, and the result is subtracted from the original transmission signal (if the peak suppression information to be subtracted from the transmission signal before suppression is made large), a rebuilt peak in the filtering process can be suppressed.

Figure 4:
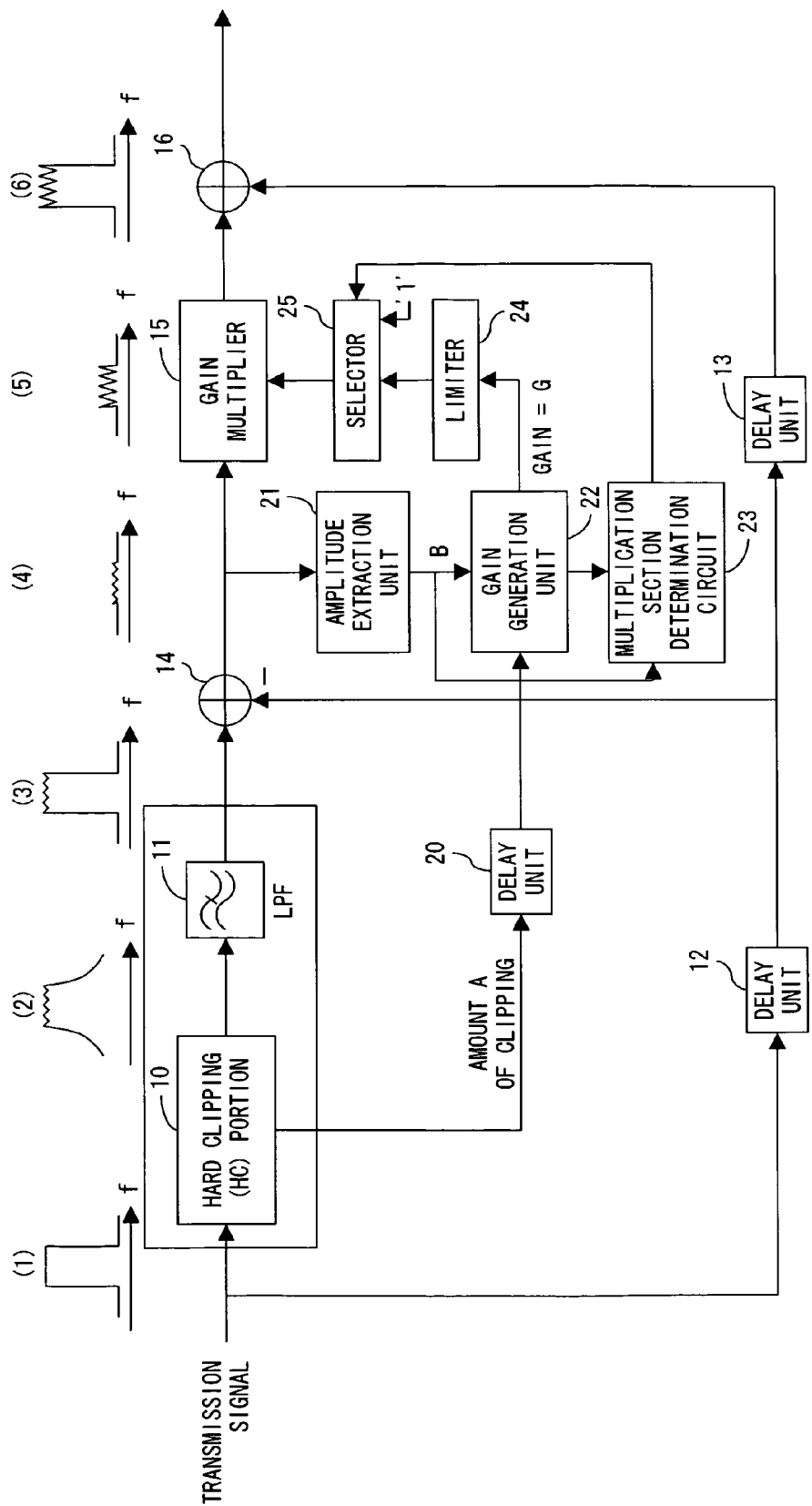
FIG. 4 shows an example of the detailed configuration according to the first embodiment of the present invention having the configuration of adaptively changing a gain G according to the level of a peak.

FIG. 4 shows an example of the detailed configuration according to the first embodiment for adaptively changing the gain G based on the size of a peak.

In FIG. 4, the same component as shown in FIG. 2 is assigned the same reference numeral, and the detailed explanation is omitted here.

The hard clipping portion 10 outputs the value of the difference between the peak value of the transmission signal and the suppression target value as the amount A of clipping. A delay unit 20 provides an appropriate delay for the amount A of clipping, which is input to a gain generation unit 22. The amplitude of the output of the subtracter 14 is extracted by an amplitude extraction unit 21, and input as a value B to the gain generation unit 22.

The gain generation unit 22 calculates and outputs the gain G as (amount A of clipping)/(value B). The calculated gain G is input to a selector 25 through a limiter 24. The limiter 24 is provided for preventing a device from performing an abnormal operation when the gain G indicates an abnormal value. That is, because the gain G is not less than 1, the lower limit of the limiter value is 1. The upper limit is to be appropriately set by those skilled in the art. The selector 25 is to generate a window for keeping timing for giving a gain. That is, a multiplication section determination circuit 23 inputs an amplitude value from the amplitude extraction unit 21, controls the selector 25 by recognizing that the timing for multiplying the gain has come when the amplitude value reaches or exceeds a predetermined value, and inputs the gain G from the gain generation unit 22 to the gain multiplier 15. When it is not time to multiply the gain G, the selector 25 is allowed to select the value "1". Thus, the gain multiplier 15 multiplies the output of the subtracter 14 by 1, and the peak suppression information is input to the adder 16. When the amplitude of the transmission signal is smaller than the suppression target value, since the output of the low pass filter 11 is the same as the delayed transmission signal, the output of the subtracter 14 is 0. Therefore, the output of the gain multiplier 15 is also 0, and the output of the adder 16 is an unprocessed transmission signal.

Figure 5:
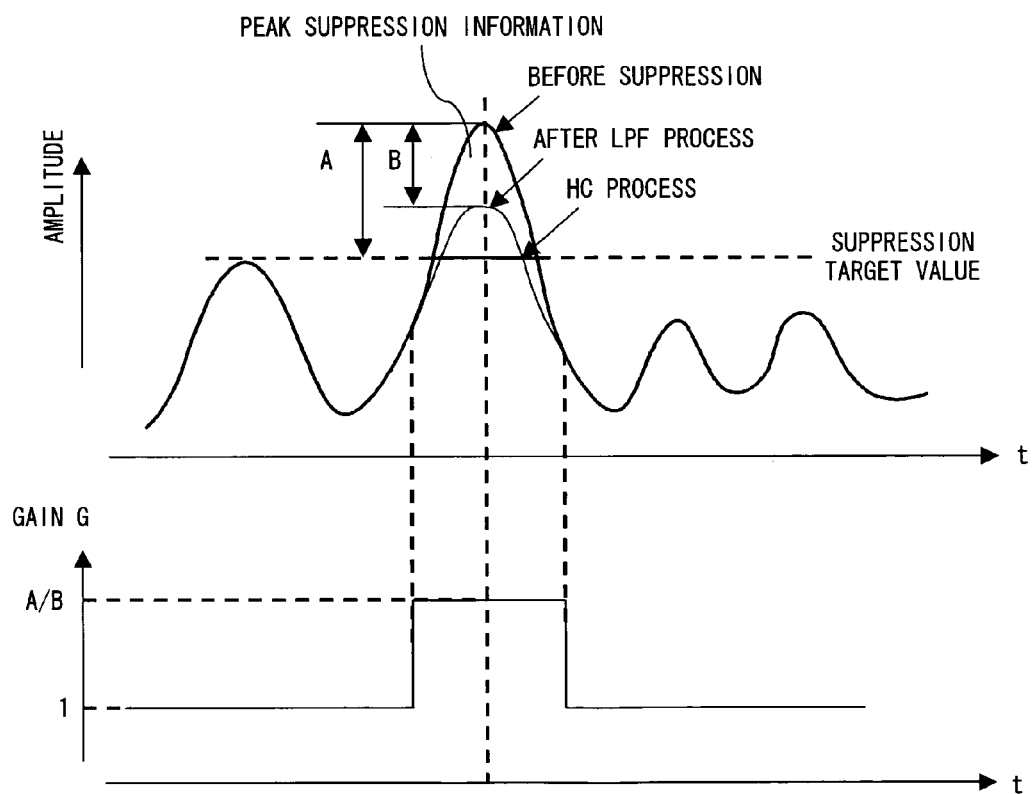
FIG. 5 is an explanatory view showing the method of obtaining the gain G by a gain generation unit 22.

FIG. 5 is an explanatory view of obtaining the gain G in the gain generation unit 22.

For the peak of the transmission signal exceeding the suppression target value, the amplitude A (amount A of clipping) of the transmission signal before peak suppression exceeding the suppression target value, and the peak difference B (value B) between the transmission signal after the filtering process and the peak before suppression are acquired. To suppress the peak of the signal rebuilt after the filtering process such that it can be equal to or smaller than the suppression target, the gain to be given to the gain multiplier 15 is G=A/B.

As described above, when there is the peak suppression information shown in FIG. 5, the gain G obtained in the above-mentioned method is multiplied by the signal with the inverse sign of the peak suppression information. When there is no peak suppression information, the selector 25 selects "1" as a gain. Therefore, the change in gain value is shown in FIG. 5.

Figure 6:
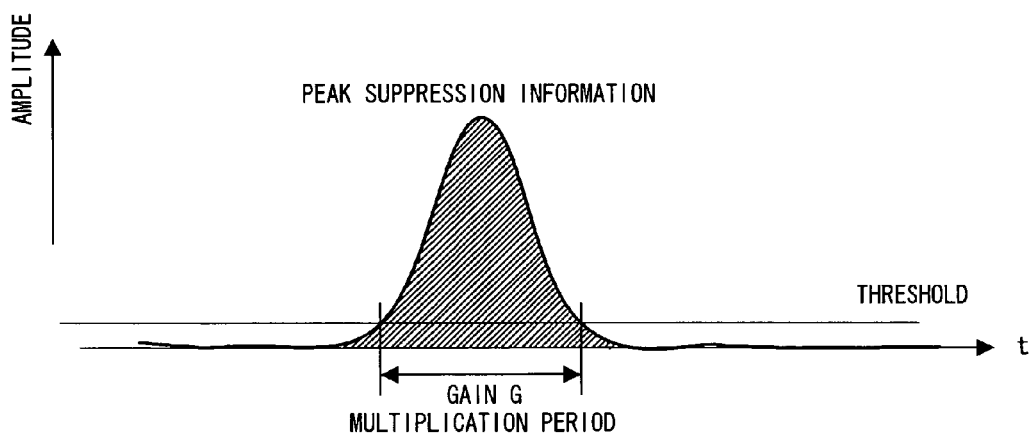
FIG. 6 is an explanatory view of the operation of a multiplication section determination circuit 23

FIG. 6 is an explanatory view of the operation of the multiplication section determination circuit 23.

The signal shown in FIG. 6 indicates the peak suppression information included in the frequency band of the transmission signal. The selector 25 is controlled such that the amplitude value of the peak suppression information is compared with the threshold, and the gain G is multiplied in the section where the relationship of "amplitude of peak suppression information>threshold" holds. The threshold is to be appropriately set by those skilled in the art.

Figure 7:
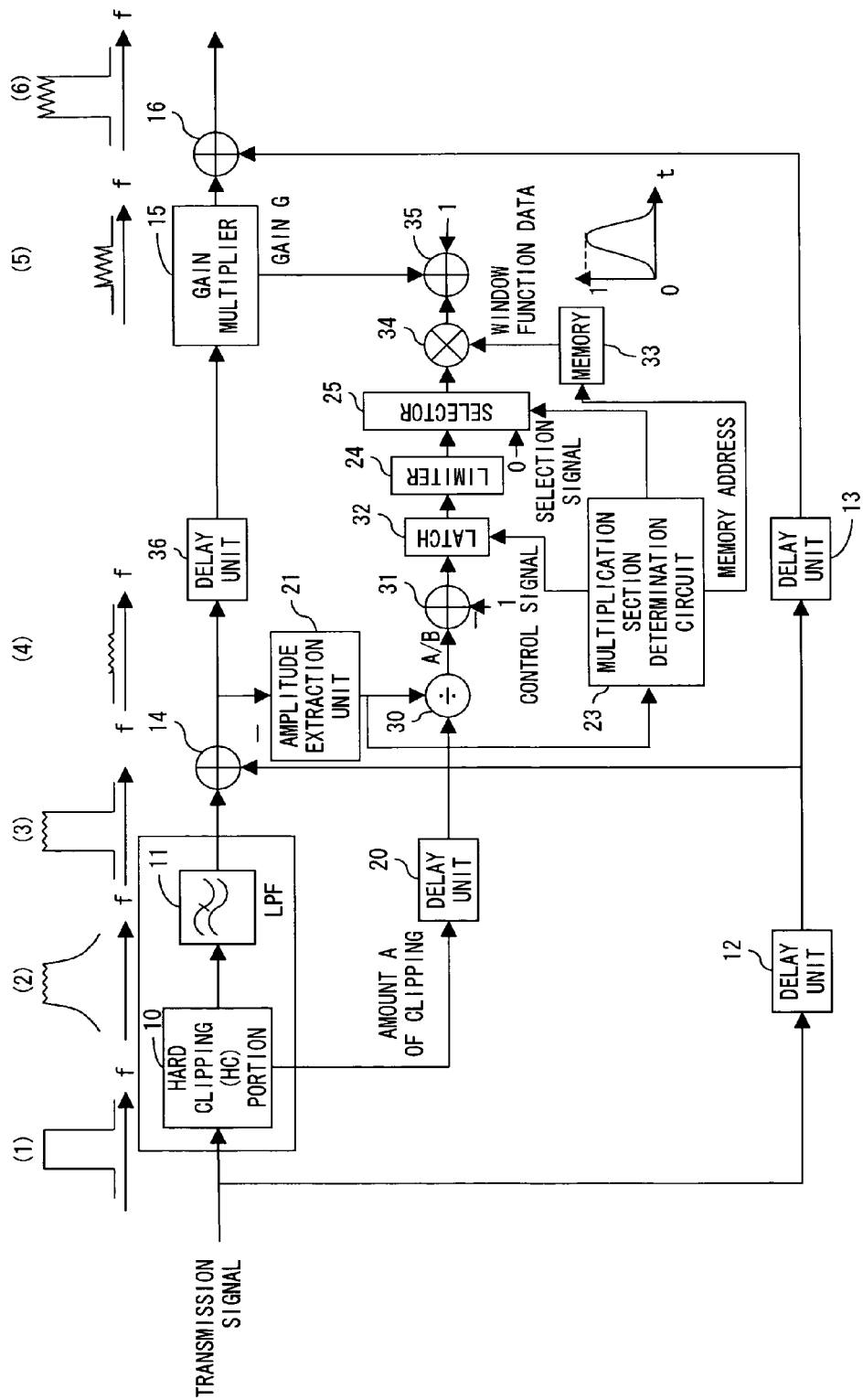
FIG. 7 shows an example of the detailed configuration according to the second embodiment of the present invention.

FIG. 7 shows an example of the detailed configuration according to the second embodiment of the present invention.

In FIG. 7, the same component as that shown in FIG. 4 is assigned the same reference numeral, and those explanations are omitted here.

The ratio of the peak value B of the peak suppression information obtained by the amplitude extraction unit 21 to the amount A of clipping is calculated by a divider 30, and a subtracter 31 subtracts 1 from the output of the divider 30. The output of the subtracter 31 is latched by a latch 32, and input to the selector 25 through the limiter 24. The limiter value of the limiter 24 is a value obtained by subtracting 1 from the limiter value shown in FIG. 4 according to the present embodiment. The multiplication section determination circuit 23 performs an operation similar to the operation shown in FIG. 4, controls the latch 32, and inputs the value obtained by subtracting 1 from the gain value G. Furthermore, the multiplication section determination circuit 23 controls memory 33 to multiply the output of the selector 25 by window function data. The window function stored in the memory 33 can be a value centering the peak portion where the maximum gain value is multiplied and gradually decreasing before and after the time direction. The window function data can be the data of high precision over the multiplication section, and rough data can also be used with an interpolating process. The window function data can also be asymmetric before and after the peak. The window function can also be flat at the peak portion and suddenly decrease at the end portion of the window function.

The multiplication section determination circuit 23 outputs an appropriate window function value from the memory 33 with the input timing of the peak suppression information, and a multiplier 34 multiplies it by the "gain value G−1". Unlike the case shown in FIG. 4, the selector 25 selects the value of "gain value G−1" or "0". An adder 35 adds 1, and the gain multiplier 15 multiplies the peak suppression information by the gain value. Thus, the gain value by which the peak suppression information is multiplied gradually becomes larger, and gradually becomes smaller after reaching the peak. Thus, the peak suppression information can be prevented from suddenly increase. That is, when the peak suppression information is suddenly multiplied by a gain value, the peak suppression information discontinuously becomes large, and the frequency component not required for the output of the adder 16 can be included. However, the generation of the unnecessary frequency component by the above-mentioned discontinuous generation can be prevented by gradually multiplying the peak suppression information by a gain value.

The delay unit 36 delays the peak suppression information by the time required to perform an arithmetic operation on the gain value.

Figure 8:
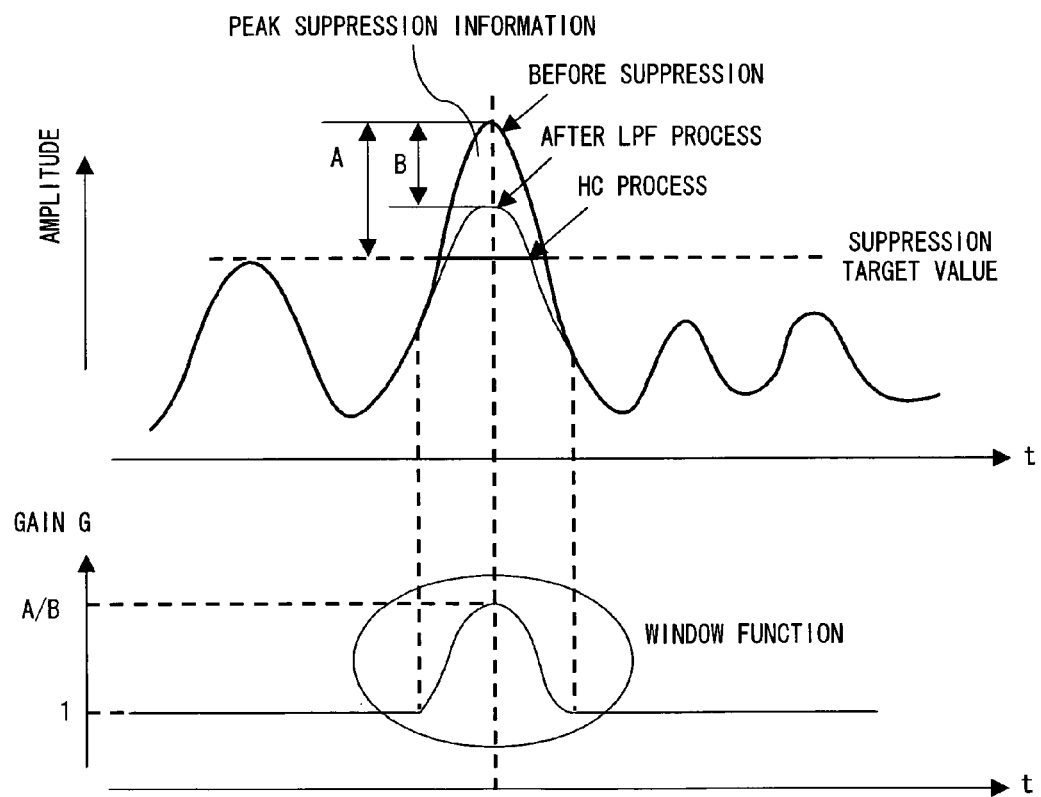
FIG. 8 is an explanatory view of the effect of the window function.

FIG. 8 is an explanatory view of the effect of the window function.

When a transmission signal shown at the upper portion in FIG. 8 is input, it is necessary to multiply the portion of the peak suppression information by a gain G. However, by the multiplication of the window function for a smooth change of a gain value as shown at the lower part in FIG. 8, a sudden change of the value of the peak suppression information can be avoided.

Figure 9:
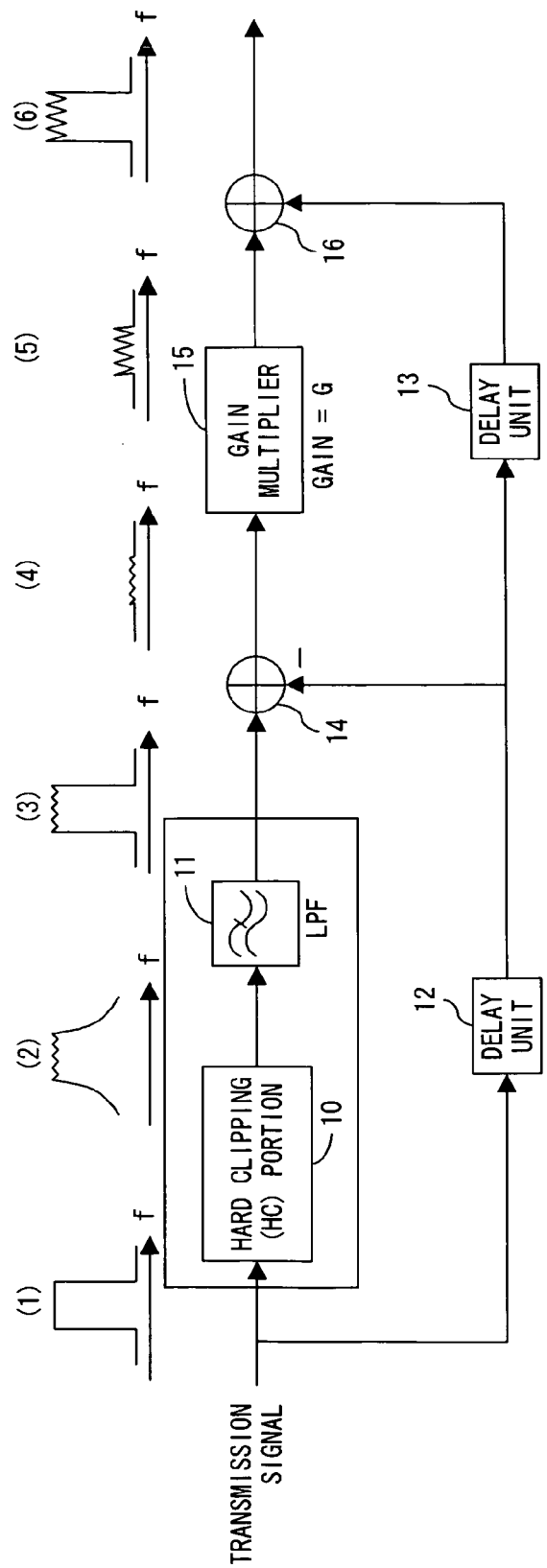
FIG. 9 is an explanatory view of an example of the configuration according to the third embodiment of the present invention.

FIG. 9 is an explanatory view showing an example of the configuration according to the third embodiment of the present invention.

In FIG. 9, the same component as shown in FIG. 6 is assigned the same reference numeral, and those explanations are omitted here.

FIG. 9 shows an embodiment in which a gain value in the gain multiplier 15 is fixed. In the output of the low pass filter 11, the level of the rebuilding of a peak when the signal peak is larger than the value of the hard clipping depends on the value of the cutoff frequency of the low pass filter 11. The larger the cutoff frequency of the low pass filter 11, the smaller the level of the rebuilding of the peak. Therefore, in the designing stage of the device shown in FIG. 9, the state of the rebuilding of the peak is checked in a simulation, etc., a designer predetermines a gain value, and the gain value selected by the designer is set in the gain multiplier 15.

Figure 10:
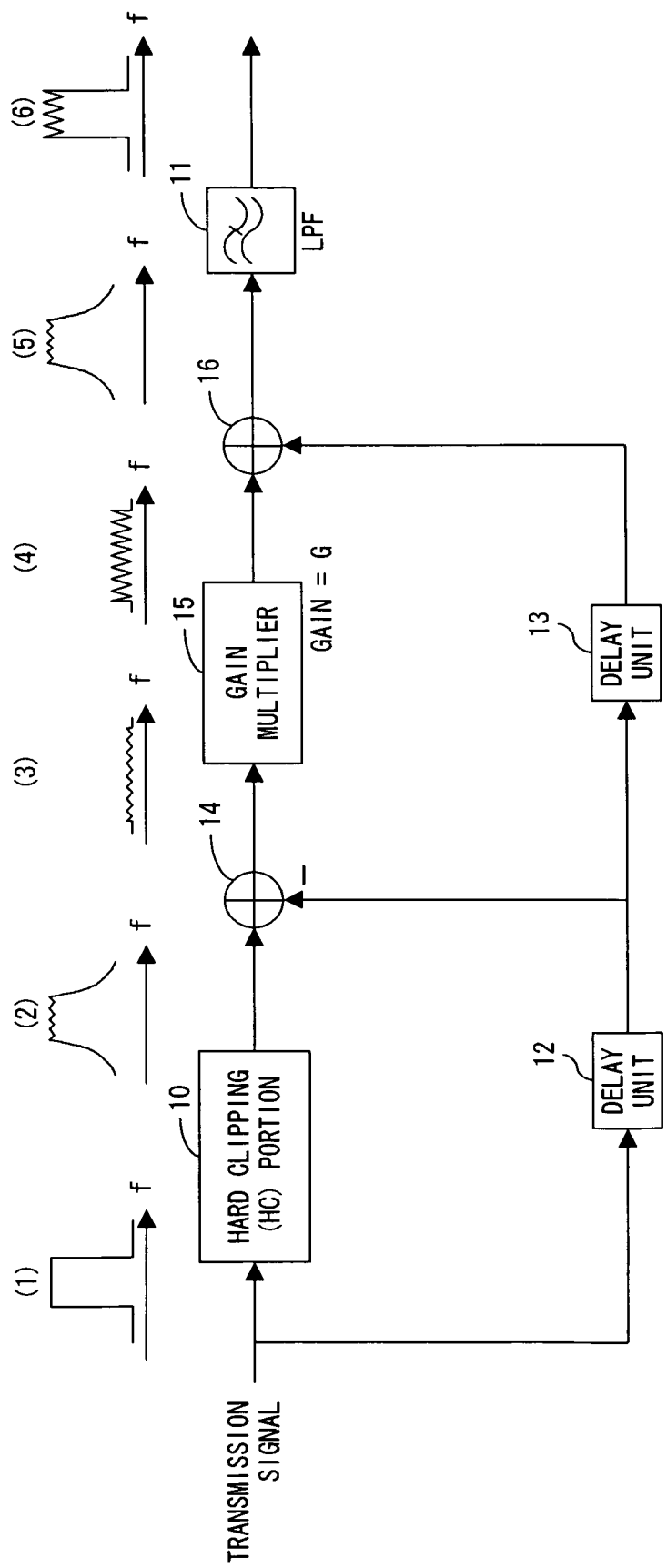
FIG. 10 shows an example of the detailed configuration according to the fourth embodiment of the present invention.

FIG. 10 is an explanatory view showing an example of the configuration according to the fourth embodiment of the present invention.

In FIG. 10, the same component as shown in FIG. 7 is assigned the same reference numeral, and those explanations are omitted.

The present configuration is valid for a signal having an unnecessary wave outside a desired frequency band as in the case of the OFDM signal generated using the IFFT. In the case of an OFDM signal, since an IFFT process is performed in a predetermined block unit, a discontinuous signal is generated at the boundary between blocks. Therefore, when an OFDM signal is generated, to remove a discontinuous portion, a signal is passed through a low pass filter, the signal amplitude of a discontinuous portion is set to 0, and so forth. Therefore, in generating a transmission signal, it is necessary to constitute a low pass filter, etc.

In the configuration shown in FIG. 10, the hard clipping process is performed on the transmission signal such as an OFDM signal, etc. which has not passed through a low pass filter, etc., the difference from the transmission signal is obtained, and a gain is provided by the gain multiplier 15. Then, the difference between the signal which is provided with a gain and processed in the hard clipping process and the transmission signal is added to the transmission signal, and passed through the low pass filter 11. Thus, since the discontinuous portion of a transmission signal and the discontinuous portion by the hard clipping can be simultaneously removed, the configuration of removing the discontinuous portion of the transmission signal can be removed.

The transmission signal of (1) above is a signal including the component outside the signal frequency band. In (2) above, by performing the hard clipping process, a signal containing another component outside the signal frequency band is generated. By subtracting the transmission signal from the above-mentioned signal, the peak suppression information can be obtained (3). A gain is provided for (3), resulting in (4), and (4) is added to the transmission signal, and (5) is obtained. Finally, the low pass filter 11 removes the component outside the signal band, and a peak-suppressed signal is obtained.

Figure 11:
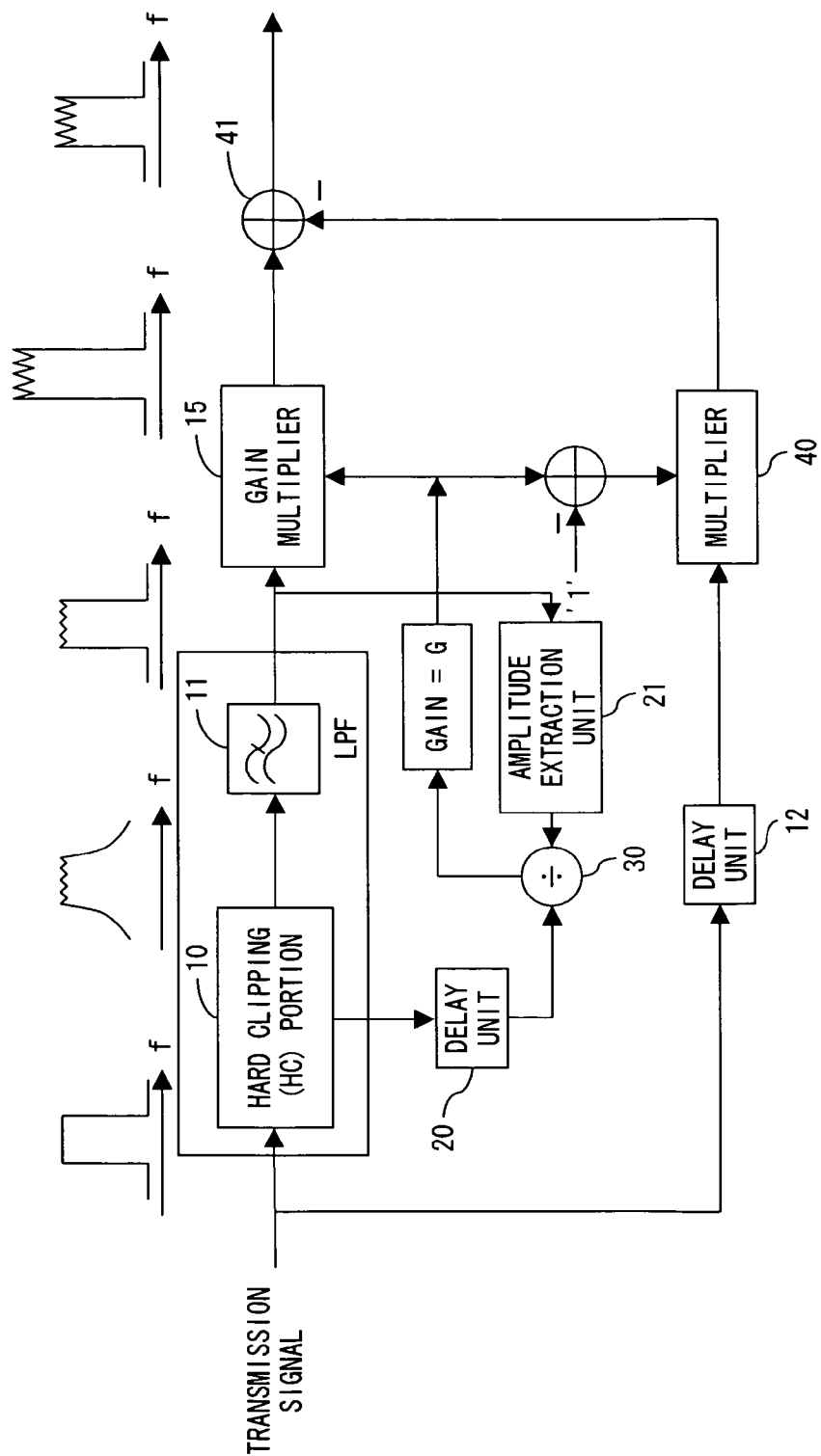
FIG. 11 shows an example of the detailed configuration according to the fifth embodiment of the present invention.

FIG. 11 is an explanatory view showing an example of the configuration of the fifth embodiment of the present invention With the present configuration, a signal peak-suppressed in the hard clipping process and the filtering process is first multiplied by a gain. Then, a signal obtained by multiplying a transmission signal by a value obtained by subtracting 1 from the gain value is subtracted from the output of the gain multiplier 15, and a desired peak-suppressed signal is obtained. The operation is explained as follows. That is, assume that the output signal of the low pass filter 11 is A, and the transmission signal is A+B. The B indicates peak suppression information. Assuming that the gain multiplied by the gain multiplier 15 is G, and the gain multiplies by the multiplier 40 is (G−1), the process by a subtracter 41 is expressed as follows.

$$A \times G - (A+B)(G-1) = A - (G-1) \times B = A + B - G \times B$$

That is, the peak suppression information B provided with a gain G is subtracted from the transmission signal A+B. As described above, with the configuration shown in FIG. 11, the effect similar to that of the configuration shown in FIG. 4 can be obtained. In FIG. 11, the gain value G can be a ratio of the output of the low pass filter 11 to the amount of clipping from the hard clipping portion 10, but it is obvious that it can be determined using a simulation from the cutoff frequency of the low pass filter 11.

Figure 12:
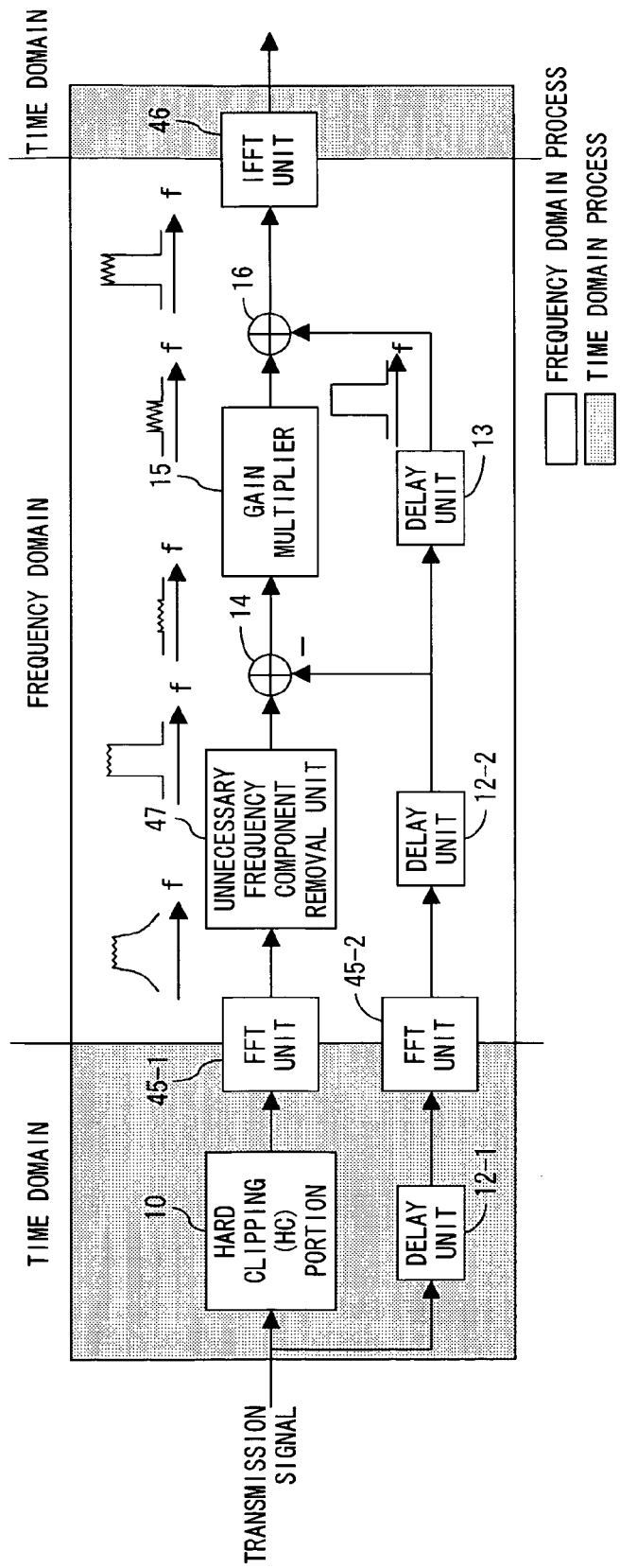
FIG. 12 shows an example of the detailed configuration according to the sixth embodiment of the present invention.

FIG. 12 shows a display of the configuration according to the sixth embodiment of the present invention.

In FIG. 12, the configuration corresponding to the components shown in FIG. 7 is assigned the similar reference numerals, and those explanations are omitted here.

In the configuration shown in FIG. 12, the filtering process and the peak-suppressed component amplifying process are performed in a frequency area, and then a time signal is restored again for transmission.

The transmission signal hard-clipped by the hard clipping portion 10, and the transmission signal delayed by the delay unit 12-1 are Fourier transformed in FFT units 45-1 and 45-2, into a signal of a frequency area. The components outside the frequency band of a signal which is hard-clipped and transformed to a signal of a frequency domain are removed by an unnecessary frequency component removal unit 47. It is the same as the function of the low pass filter. By subtracting the delayed transmission signal of the frequency domain from the output of the unnecessary frequency component removal unit 47, a peak suppression information with an inverse sign can be obtained. The peak suppression information is multiplied by the gain G, the adder 16 subtracts the peak suppression information from the transmission signal, an IFFT unit 46 performs an inverse Fourier transform on the output of the adder 16, thereby generating and transmitting a signal of a time domain.

In FIG. 12, the process is performed in the frequency domain based on the configuration shown in FIG. 4, but those skilled in the art can easily anticipate that it also holds true with the configuration shown in FIG. 11.

FIG. 12 shows an example of the configuration according to the seventh embodiment of the present invention.

Figure 13:
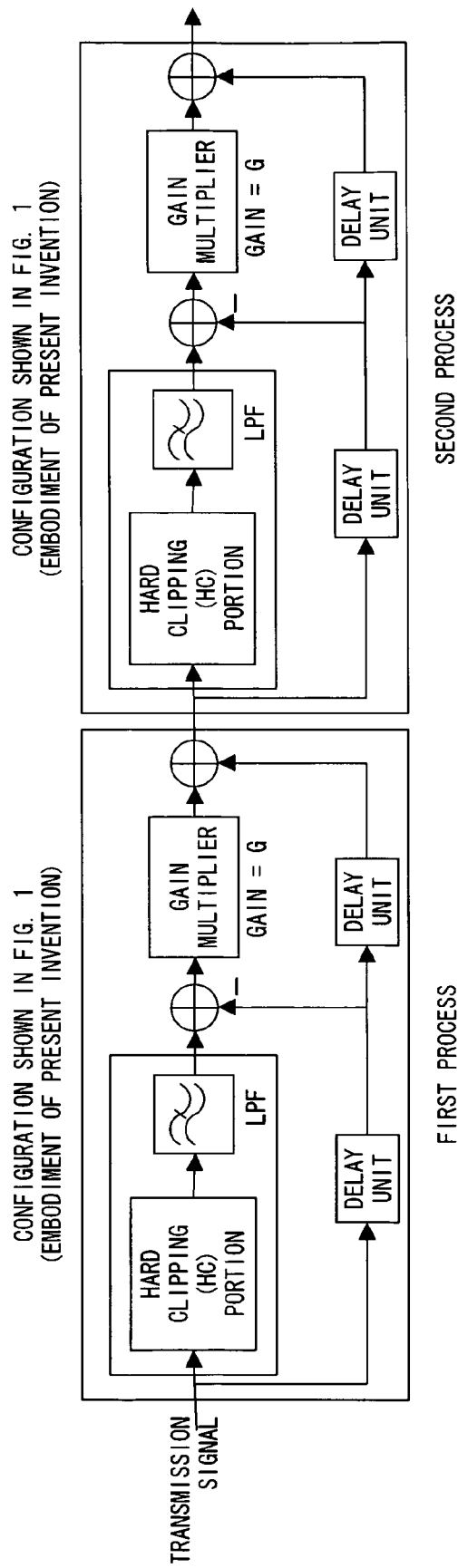
FIG. 13 shows an example of the detailed configuration according to the seventh embodiment of the present invention.

In FIG. 13, the configuration corresponding to the component shown in FIG. 7 is assigned similar reference numerals, and those explanations are omitted here.

By performing the process according to an embodiment of the present invention plural times, the performance can be furthermore improved. That is, by connecting plural stages (two stages in FIG. 13) of the configurations in series according to the first through sixth embodiments, the peak suppression performance is improved. In FIG. 13, each configuration is based on the basic configuration shown in FIG. 2, but it is possible to optionally combine the configuration according to the first through sixth embodiments.

What is claimed is:

1. A peak voltage suppression apparatus, comprising:
   a temporary peak suppression unit to temporarily suppress a peak of amplitude of a signal;
   a difference signal acquisition unit to acquire a difference signal between the temporarily suppressed signal and an original signal;
   a gain unit to give a gain to the difference signal;
   a final peak suppression unit to generate a signal whose amplitude peak is finally suppressed by subtracting the difference signal given the gain from the original signal, wherein
   the temporary peak suppression unit comprises:
      a hard clipping unit to clip an amplitude of a signal to a predetermined value; and
      a filter unit to perform a filtering process on the clipped signal, wherein
   the filter unit is a low pass filter, and wherein
   the gain is set to a value depending on a cutoff frequency of the low pass filter.

2. A peak voltage suppression apparatus, comprising:
   a temporary peak suppression unit to temporarily suppress a peak of amplitude of a signal;
   a difference signal acquisition unit to acquire a difference signal between the temporarily suppressed signal and an original signal;
   a gain unit to give a gain to the difference signal;
   a final peak suppression unit to generate a signal whose amplitude peak is finally suppressed by subtracting the difference signal given the gain from the original signal, wherein
   the temporary peak suppression unit comprises:
      a hard clipping unit to clip an amplitude of a signal to a predetermined value; and
      a filter unit to perform a filtering process on the clipped signal, and wherein,
   the gain is determined based on a ratio of an amount of clipping of a signal to an amount of suppression of a signal after a filtering process to the original signal.

3. A peak voltage suppression apparatus, comprising:
   a temporary peak suppression unit to temporarily suppress a peak of amplitude of a signal;
   a difference signal acquisition unit to acquire a difference signal between the temporarily suppressed signal and an original signal;
   a gain unit to give a gain to the difference signal;
   a final peak suppression unit to generate a signal whose amplitude peak is finally suppressed by subtracting the difference signal given the gain from the original signal, wherein
   the temporary peak suppression unit comprises:
      a hard clipping unit to clip an amplitude of a signal to a predetermined value; and
      a filter unit to perform a filtering process on the clipped signal, and wherein the gain is given to the difference signal through a smoothly changing window function.

4. A peak voltage suppression apparatus, comprising:
a temporary peak suppression unit to temporarily suppress a peak of amplitude of a signal;
a difference signal acquisition unit to acquire a difference signal between the temporarily suppressed signal and an original signal;
a gain unit to give a gain to the difference signal;
a final peak suppression unit to generate a signal whose amplitude peak is finally suppressed by subtracting the difference signal given the gain from the original signal, wherein
the temporary peak suppression unit comprises:
a hard clipping unit to clip an amplitude of a signal to a predetermined value; and
a filter unit to perform a filtering process on the clipped signal, and wherein
the gain is given to the difference signal through a limiter unit prescribing an upper limit and a lower limit.

5. A peak voltage suppression apparatus, comprising:
a temporary peak suppression unit to temporarily suppress a peak of amplitude of a signal;
a difference signal acquisition unit to acquire a difference signal between the temporarily suppressed signal and an original signal;
a gain unit to give a gain to the difference signal;
a final peak suppression unit to generate a signal whose amplitude peak is finally suppressed by subtracting the difference signal given the gain from the original signal, wherein
the temporary peak suppression unit comprises:
a hard clipping unit to clip an amplitude of a signal to a predetermined value; and
a filter unit to perform a filtering process on the clipped signal, and wherein
the gain is given to the difference signal when an amplitude of the difference signal is equal to or exceeding a predetermined threshold.

6. A peak voltage suppression apparatus, comprising:
a temporary peak suppression unit temporarily suppressing a peak of amplitude of a signal;
a first gain unit giving a gain to a temporarily suppressed signal;
a second gain unit giving to an original signal a gain obtained by subtracting 1 from a gain in the first gain unit;
a final peak suppression unit generating a signal whose amplitude peak is finally suppressed by subtracting a signal to which a gain is given by the second gain unit from a signal to which a gain is given by the first gain unit.

7. The apparatus according to claim 6, wherein
the temporary peak suppression unit comprises:
a hard clipping unit clipping the amplitude of a signal to a predetermined value; and
a filter unit performing a filtering process on the clipped signal.

8. The apparatus according to claim 7, wherein
the filter unit is a low pass filter.

9. The apparatus according to claim 8, wherein
the gain is set to a value depending on a cutoff frequency of the low pass filter.

10. The apparatus according to claim 8, wherein
the gain is determined based on a ratio of an amount of clipping of a signal to an amount of suppression of a signal after a filtering process to an original signal.

11. The apparatus according to claim 7, further comprising:
a Fourier transform unit converting a signal of a time domain to a frequency domain; and
an inverse Fourier transform unit converting a signal of a frequency domain to a time domain, wherein
a process from the filter unit to the final peak suppression unit is performed in a frequency domain.

12. The apparatus according to claim 6 wherein
the peak voltage suppression apparatuses according to claim 11 are connected in series.

13. A peak voltage suppressing method by a peak voltage suppressing apparatus, the method comprising:
temporarily suppressing a peak of amplitude of a signal using a suppression unit;
acquiring a difference signal between the temporarily suppressed signal and an original signal using a difference unit;
giving a gain to the difference signal using a gain unit;
generating a signal whose amplitude peak is finally suppressed by subtracting a difference signal which is given the gain from the original signal using a peak suppression unit;
filtering the original signal with a low pass filter; and
setting the gain to a value depending on a cutoff frequency of the low pass filter.

14. A peak voltage suppressing method by a peak voltage suppressing apparatus, the method comprising:
temporarily suppressing a peak of amplitude of a signal using a first gain unit;
giving a gain to the temporarily suppressed signal using a second gain unit;
giving to the original signal a gain obtained by subtracting 1 from a gain in a first gain step; and
generating a signal whose amplitude peak is finally suppressed by subtracting a signal to which a gain is given by the second gain step from the signal to which a gain is given by the first gain step using a peak suppression unit.

* * * * *